United States Patent
Zhang

(10) Patent No.: US 10,991,440 B2
(45) Date of Patent: Apr. 27, 2021

(54) PERFORMING READ OPERATION PRIOR TO TWO-PASS PROGRAMMING OF STORAGE SYSTEM

(71) Applicant: MICRON TECHNOLOGY, INC., Boise, ID (US)

(72) Inventor: Yang Zhang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/636,309

(22) PCT Filed: Mar. 7, 2018

(86) PCT No.: PCT/CN2018/078340
§ 371 (c)(1),
(2) Date: Feb. 3, 2020

(87) PCT Pub. No.: WO2019/169586
PCT Pub. Date: Sep. 12, 2019

(65) Prior Publication Data
US 2021/0043263 A1   Feb. 11, 2021

(51) Int. Cl.
*G11C 16/34* (2006.01)
*G11C 16/10* (2006.01)
*G11C 16/26* (2006.01)
*G11C 16/08* (2006.01)
*G11C 29/42* (2006.01)

(52) U.S. Cl.
CPC .......... *G11C 16/3459* (2013.01); *G11C 16/08* (2013.01); *G11C 16/10* (2013.01); *G11C 16/26* (2013.01); *G11C 16/3418* (2013.01); *G11C 29/42* (2013.01)

(58) Field of Classification Search
CPC . G11C 16/3459; G11C 16/3418; G11C 16/08; G11C 16/26; G11C 29/42; G11C 16/10
See application file for complete search history.

(56) References Cited

U.S. PATENT DOCUMENTS

| | | | |
|---|---|---|---|
| 9,443,579 B2 * | 9/2016 | Lee | ..................... G11C 11/5635 |
| 10,540,228 B2 * | 1/2020 | Kaynak | ................. G06F 3/0611 |
| 2009/0219779 A1 | 9/2009 | Mao et al. | |

FOREIGN PATENT DOCUMENTS

| CN | 1421789 A | 6/2003 |
|---|---|---|
| CN | 2704877 Y | 6/2005 |
| CN | 202049471 U | 11/2011 |

OTHER PUBLICATIONS

PCT International Search Report and Written Opinion for International Application No. PCT/CN2018/078340, dated Nov. 28, 2018, 9 pages.

* cited by examiner

*Primary Examiner* — Gene N Auduong
(74) *Attorney, Agent, or Firm* — Lowenstein Sandler LLP

(57) ABSTRACT

Data from a first portion of a memory cell of a plurality of memory cells is read. A first programming pass is performed on another memory cell of the plurality of memory cells by providing new data to the another memory cell. A second programming pass is performed on the memory cell by providing additional data to the first portion of the memory cell based on the reading of the first portion of the memory cell. The first programming pass and the second programming pass correspond to a two-pass programming operation associated with the plurality of memory cells.

20 Claims, 5 Drawing Sheets

PERFORMING READ OPERATION PRIOR TO TWO-PASS PROGRAMMING OF STORAGE SYSTEM

TECHNICAL FIELD

The present disclosure generally relates to a storage system, and more specifically, relates to performing a read operation prior to two-pass programming of a storage system.

BACKGROUND

A storage system (e.g., solid-state drive) can include one or more memory components that store data. For example, the storage system can include memory devices such as non-volatile memory devices. The storage system can further include a controller that can manage each of the memory devices and allocate data to be stored at the memory devices. A host system can utilize the storage system and request data from the storage system. The controller can retrieve data from the corresponding memory devices and return the retrieved data to the host system.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
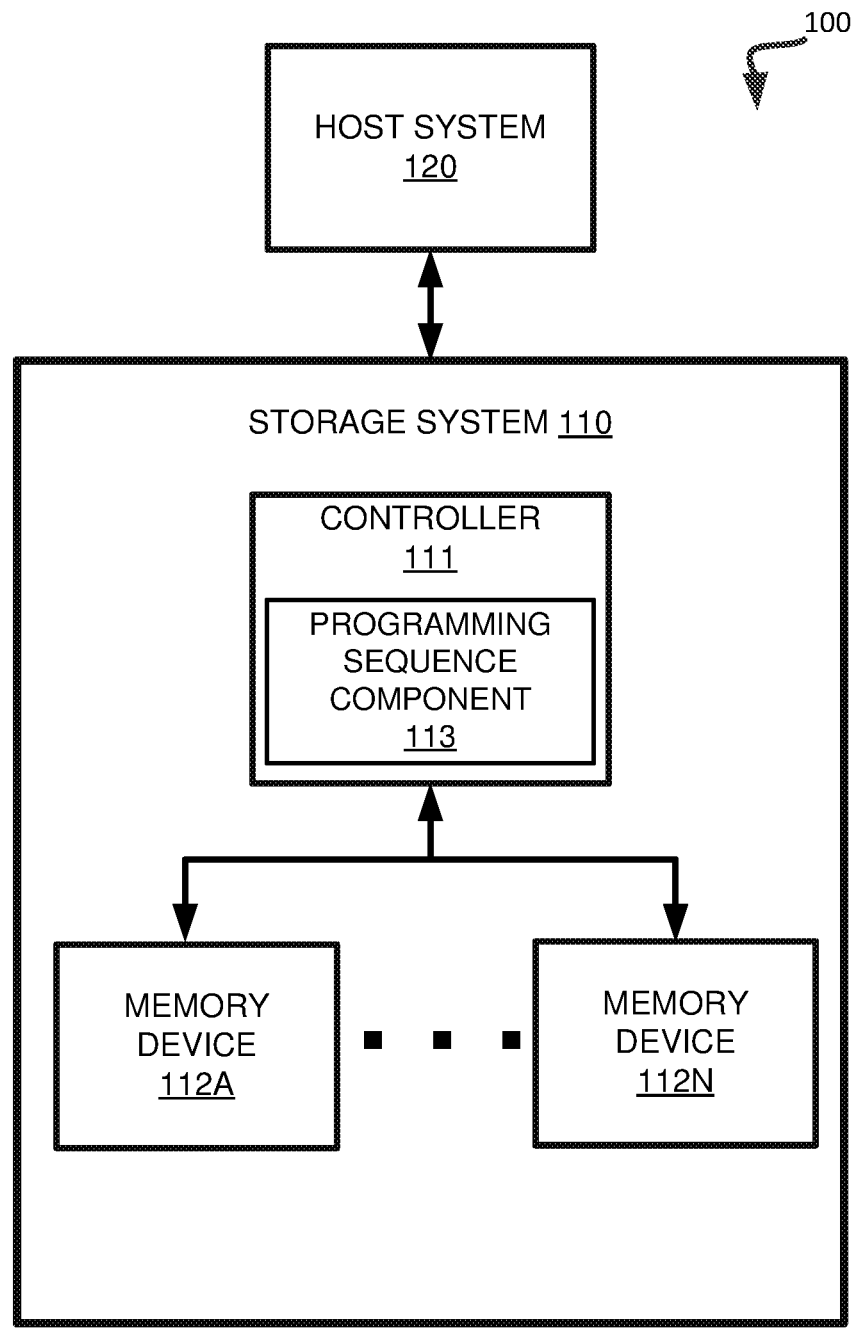
FIG. 1 illustrates an example computing environment that includes a storage system in accordance with some embodiments of the present disclosure.

Aspects of the present disclosure are directed to performing a read operation prior to two-pass programming of a storage system. In general, a host system can utilize a storage system that includes one or more memory devices. An example of a storage system is a solid-state drive (SSD). The host system can provide data to be stored at the storage system and can request data to be retrieved from the storage system.

The storage system can store the data at a memory device included in the storage system. The memory device can include memory cells. Each of the memory cells can store one or more bits of binary data corresponding to the data received from the host system. The memory device can include a quad-level cell (QLC) memory. In QLC memory, each memory cell can store four bits of data. For example, in a QLC memory, a memory cell can store four bits of data (e.g., 1111, 0000, 1101, etc.) corresponding to data received from the host system. Each bit of a memory cell is stored at a different portion (also referred to as "page" hereafter) of the memory cell. A memory cell of the QLC memory can have a total of four pages. For example, the memory cell can include a lower page (LP), an upper page (UP), an extra page (XP) and a top page (TP), where each page stores a bit of data. For example, a bit can be represented by each of the four pages of the memory cell.

Generally, the storage system can receive a request from a host system to perform a programming operation to store data at the QLC memory. The storage system can then perform a two-pass programming operation on the memory cells. During a first programming pass of the two-pass programming operation, the controller can program or write data to three portions of a memory cell of the storage system. For example, the controller can program (e.g., write data to) the LP, UP and XP of the memory cell.

In a flash memory, memory cells that are adjacent or proximate to each other can be coupled so that data provided to a first memory cell can alter data previously stored at a second memory cell that is adjacent or proximate to the first memory cell. For example, the programming of the LP, UP, and XP of the first memory cell can alter the data stored at the XP of the second memory cell. The alteration can be a result of a voltage that is applied to program the first memory cell also impacting the data stored at the second memory cell. Such an alteration of the XP of the second memory cell can result in an error of the data stored at the XP of the second memory cell. Accordingly, the programming operations performed on the first memory cell during the first programming pass can increase an error rate for data previously stored at a second memory cell that is adjacent or proximate to the first memory cell. Therefore, during a second programming pass of a conventional two-pass programming operation, the storage system can perform a read operation on a first portion of the second memory cell. For example, the storage system can perform the read operation on the XP of the second memory cell.

During the performance of the read operation, the storage system can determine whether the data stored at XP of the second memory cell includes an error. If the storage system determines that the data stored at the XP of the second memory cell includes an error, then the storage system can use an error correction operation to correct the error at the XP of the second memory cell. During the second programming pass of the second memory cell, the storage system can also program a second portion of the second memory cell. For example, the storage system can perform a programming operation on TP of the second memory cell after the performance of the read operation and error correction of the XP of the second memory cell. Then, the controller can program the first portion of the second memory cell. For example, the storage system can program XP of the second memory cell by providing the data corrected by the error correction operation during the read operation to XP and can program TP of the second memory cell after the corrected data is provided to XP.

However, the rate of data transfer (also referred to as "bandwidth" hereafter) of the flash memory can vary between the first programming pass and the second programming pass. For example, the bandwidth during the first programming pass can be greater than the bandwidth during the second programming pass. Therefore, performing three operations (e.g., the read operation of XP and two programming operations for TP and XP) during the second programming pass that has a lower bandwidth than the first programming pass can increase the latency of the storage system when performing program or write operations, resulting in a decrease in the performance of the storage system.

Furthermore, in a conventional storage system, in the case of power loss during a two-pass programming operation, there can be insufficient time to read data from a memory device and perform any error correction operations on the data. Accordingly, the data can be read after the two-pass programming operation has completed. If the data includes an error and an error correction operation to correct the error is unsuccessful, then the data previously programmed to the memory cell during the two-pass programming operation can be reprogrammed to a new memory cell. This results in an increased amount of programming operations being performed on the memory device as the same data is programmed two times (e.g., once to the memory cell associated with the unsuccessful error correction operation and once to the new memory cell). This can result in an increase in the latency of the storage system when performing program or write operations, resulting in a decrease in the performance of the storage system.

Aspects of the present disclosure address the above and other deficiencies by performing a read operation prior to a two-pass programming operation. The read operation can be performed on a first portion of a memory cell of a memory device. During the read operation, errors associated with the data stored at the first portion of the memory cell can be identified. If an error is identified, then an error correction operation can be performed on the data to correct the data. A first programming pass of the two-pass programming operation can be performed by providing data to be stored at the other memory cell.

A second programming pass of the two-pass programming operation is then performed on the memory cell that was read prior to the first programming pass. The storage system performs the second programming pass by providing data to the first portion of the memory cell based on the read operation that was performed on the first portion of the memory cell before the first programming pass. In one implementation, the data corrected by an error correction operation is provided to be stored at the first portion of the memory cell. For example, the corrected data can be provided to the XP of the memory cell. In some implementations, data read from the first portion of the memory cell can be determined to not include an error. Accordingly, the data read during the first programming pass can be provided to the first portion of the memory cell to refresh the data stored at the memory cell.

Thus, performing a read operation prior to a two-pass programming operation can result in improved performance of the storage system by performing an additional operation (e.g., the read operation of the a memory cell) prior to the second programming pass, which has a lower bandwidth than the first programming pass. Accordingly, the overall time to perform both the first and second programming passes at the storage system is reduced. As a result, the performance of the storage system can be improved by decreasing the latency of the storage system when programming or writing data to the storage system.

In addition, performing the read operation prior to the two-pass programming operation can result in improved performance of the storage system in the event of power loss. By performing the read operation prior to the performance of the two-pass programming operation, an unsuccessful error correction operation on the data can be identified prior to the performance of any programming operations on the memory cell that includes the data associated with the unsuccessful error correction operation. In response to the unsuccessful error correction operation, a new memory cell can be identified for the two-pass programming operation to be performed on rather than the memory cell that stores the data associated with the unsuccessful error correction operation. This can reduce the number of programming operations being performed by the storage system, resulting in an improvement in the performance of the storage system by decreasing the latency of the storage system in the event of a power loss.

FIG. 1 illustrates an example computing environment 100 that includes a memory system in accordance with some implementations of the present disclosure. The memory system can include media, such as memory devices 112A to 112N. The memory devices 112A to 112N can be volatile memory devices, non-volatile memory devices, or a combination of such. In some embodiments, the memory system is a storage system (e.g., storage system 110). An example of a storage system 110 is a solid-state drive (SSD). In general, the computing environment 100 can include a host system 120 that uses the storage system 110. In some implementations, the host system 120 can write data to the storage system 110 and read data from the storage system 110. In some embodiments, the memory system is a hybrid memory/storage system.

The host system 120 can be a computing device such as a desktop computer, laptop computer, network server, mobile device, or such computing device that includes a memory and a processing device. The host system 120 can include or be coupled to the storage system 110 so that the host system 120 can read data from or write data to the storage system 110. The host system 120 can be coupled to the storage system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the storage system 110. The host system 120 can further utilize an NVM Express (NVMe) interface to access the memory devices 112A to 112N when the storage system 110 is coupled with the host system 120 by the PCIe interface. The physical host interface can provide an interface for passing control, address, data, and other signals between the storage system 110 and the host system 120.

As shown in FIG. 1, the storage system 110 can include a controller 111 and memory devices 112A to 112N. In some implementations, the memory devices 112A to 112N can be based on non-volatile memory. In some implementations, the memory devices 112A to 112N can be a negative- and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The controller 111 can communicate with the memory devices 112A to 112N to perform operations such as reading data, writing data, or erasing data at the memory devices 112A to 112N and other such operations. The controller 111 can include hardware such as one or more integrated circuits and/or discrete components, a processing device, a buffer memory, software such as firmware or other instructions, or a combination thereof. In general, the controller 111 can receive commands or operations from the host system 120 and can convert the commands or operations into instructions or appropriate commands to achieve the desired access to the memory devices 112A to 112N. The controller 111 can be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 111 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

Referring to FIG. 1, the controller 111 can include a programming sequence component 113 that can be used to perform programming operations (e.g., first and second programming passes) on memory devices 112A to 112N. The programming sequence component 113 may identify memory cells of a memory device 112A to 112N. The programming sequence component 113 can perform a first programming pass on the identified memory cells. Subsequently, the programming sequence component 113 can perform a second programming pass on the identified memory cells. In some implementations, the programming sequence component 113 can perform an error correction operation on data read from the identified memory cells. Further details with regards to the operations of the programming sequence component 113 are described below.

The storage system 110 can also include additional circuitry or components that are not illustrated. In some implementations, the storage system 110 can include a cache or buffer (e.g., DRAM) and address circuitry (e.g., a row decoder and a column decoder) that can receive an address from the controller 111 and decode the address to access the memory devices 112A to 112N.

Figure 2:
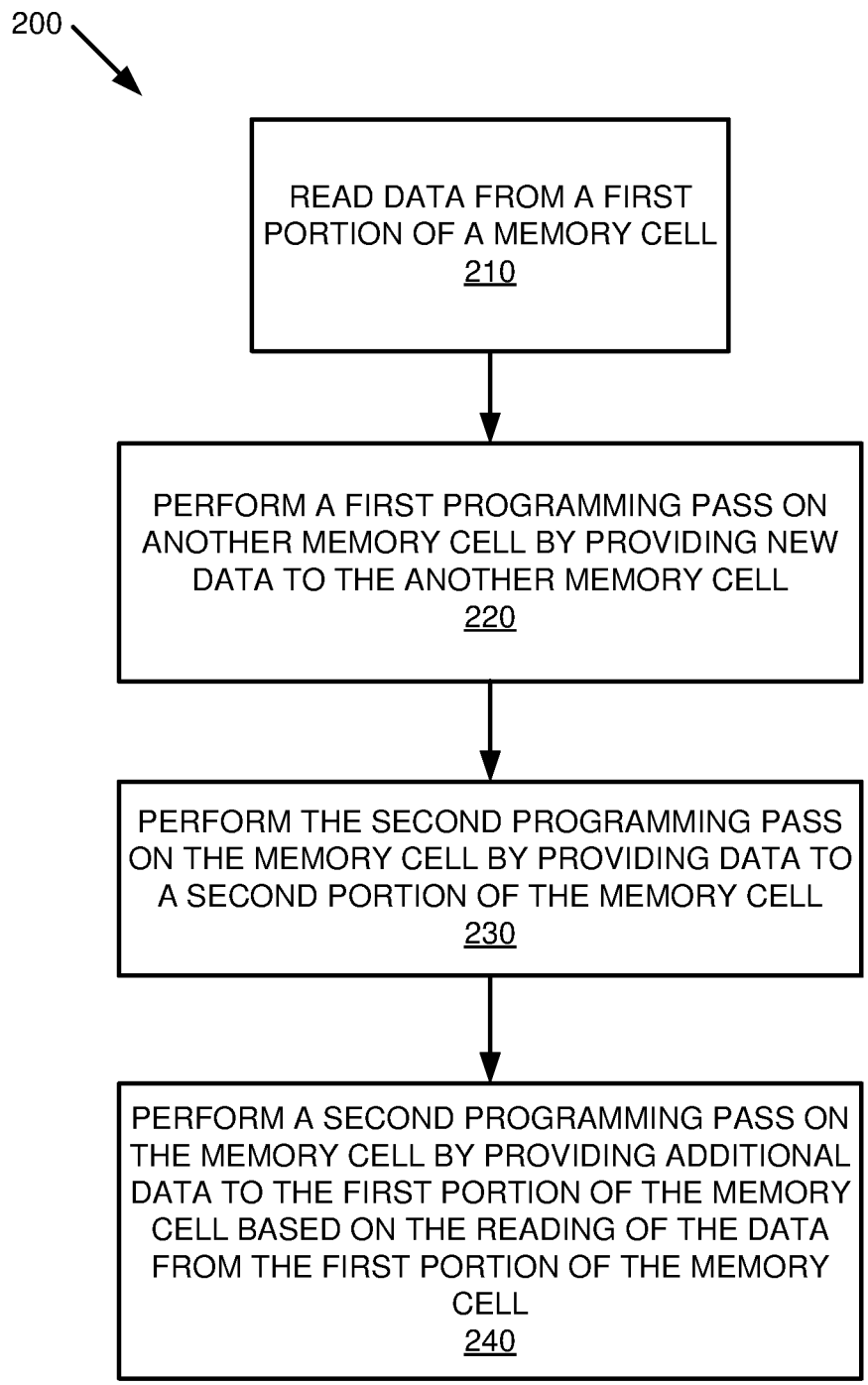
FIG. 2 is a flow diagram of an example method to perform a read operation prior to two-pass programming in accordance with some embodiments of the present disclosure.

FIG. 2 is a flow diagram of an example method 200 to perform a read operation prior to two-pass programming in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 200 can be performed by the programming sequence component 113 of FIG. 1.

At block 210, a first portion of a memory cell of a memory device is read. For example, data at the XP of a memory cell can be read. In some implementations, data that is read from the first portion of the memory cell was written to the memory cell during a previous programming operation (e.g., a prior first programming pass of a prior two-pass programming operation). In one implementation, the first portion of the memory cell is read in response to a request to store other data at the memory device. In some implementations, a processing device can determine that the data read at the first portion of the memory cell includes an error. Accordingly, an error correction operation can be performed on the data read at the first portion. In some implementations, an error-correcting code (ECC) operation or another type of error detection and correction operation can be used to detect and correct the error. For example, if the data read at the first portion of the memory cell corresponds to a value of 1, then the error can be corrected by changing the value from a 1 to a 0. At block 220, a first programming pass is performed on another memory cell of the memory device. For example, new data can be provided to the other memory cell. In some implementations, the memory cell read at block 210 and the other memory cell can be on a same word line of the memory device. For example, the memory cell can be coupled with the other memory cell at the same word line. In one implementation, the data can be provided to the LP, UP and XP of the other memory cell. For example, the data received from the host system can be written to the LP, UP and XP of the another memory cell.

At block 230, a second programming pass is performed on the memory cell by providing additional data to a second portion of the memory cell. For example, the additional data can be provided to the TP of the second memory cell. In some implementations, the data provided to the TP of the second memory cell can correspond to data received from the host system. At block 240, the second programming pass provides data to the first portion of the memory cell based on the reading of the first portion of the memory cell. For example, if the data read at the XP of the memory cell at block 210 included an error, then the processing device can provide the corrected data to the XP of the memory cell. In implementations, the processing device can determine that the data read at XP does not include an error. Accordingly, the processing device can provide the data that was read at block 210 to the XP of the memory cell to refresh the data stored at the XP of the memory cell.

As such, a two-pass programming operation can be performed with respect to a first memory cell and a second memory cell. Before a first programming pass of the two-pass programming operation is performed, a read operation can be performed to retrieve data from a portion of the second memory cell. The retrieved data was programmed to the second memory cell during a prior two-pass programming operation. Errors from the retrieved data can be corrected to generate corrected data. A first programming pass of the two-pass programming operation can be performed on the first memory cell. The second programming pass can then provide additional data to another portion of the second memory cell. Then a second programming pass can be performed on the second memory cell by providing the corrected data to the portion of the second memory cell. As a result, if another programming pass inadvertently changed the data stored at the portion of the second memory cell, then providing of the corrected data to the second portion of the memory cell can ensure that the data stored at the portion of the second memory cell does not include errors.

Figure 3:
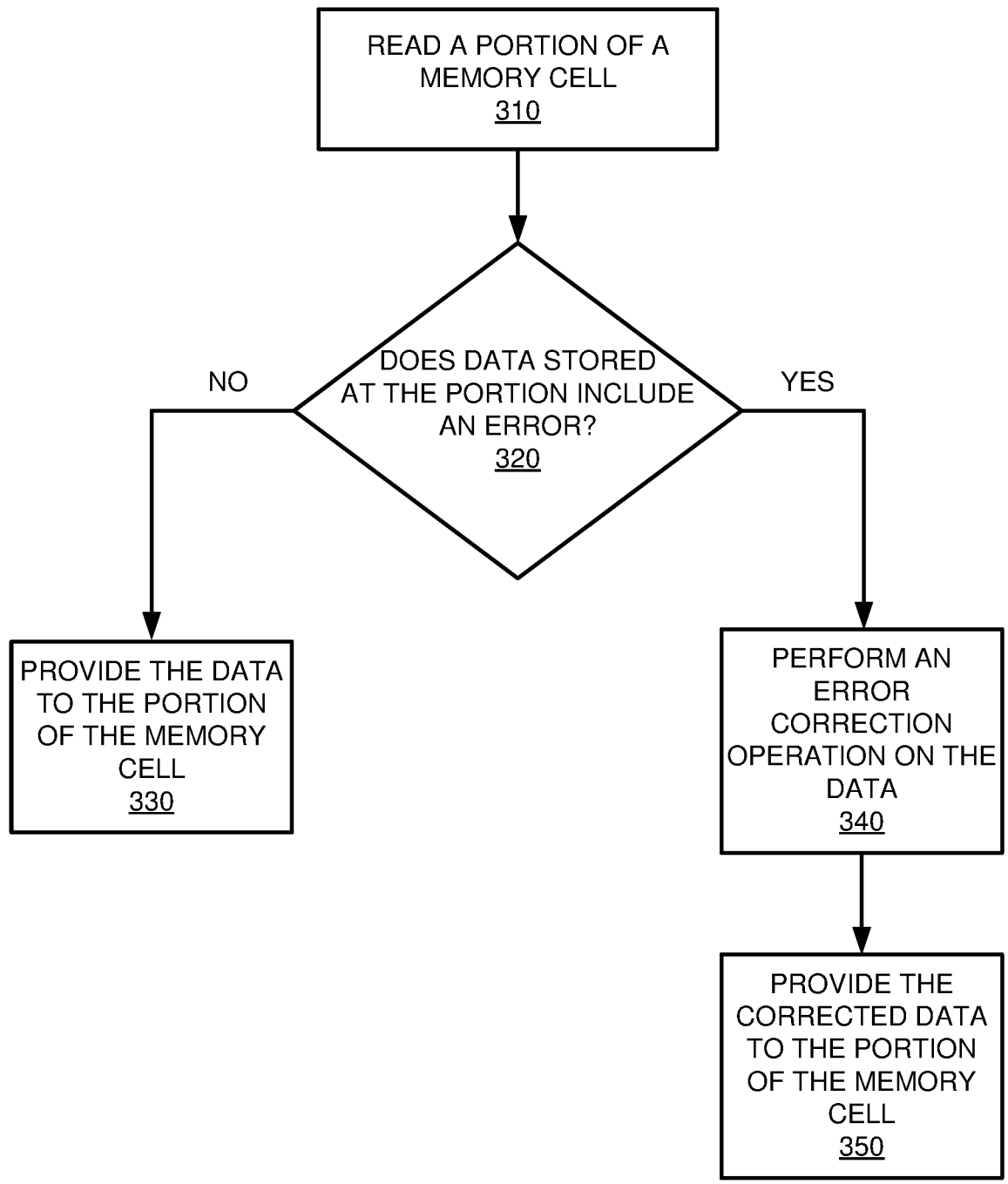
FIG. 3 is a flow diagram of an example method to perform an error correction operation on data read at a portion of a memory cell in accordance with some embodiments of the present disclosure.

FIG. 3 is a flow diagram of an example method 300 to perform an error correction operation on data read at a portion of a memory cell in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 300 can be performed by the programming sequence component 113 of FIG. 1.

At block 310, a portion of a memory cell is read. For example, data can be read from the XP of the memory cell that was previously programmed as part of a first programming pass of a prior two-pass programming operation. At block 320, a processing device determines if data stored at the portion of the memory cell includes an error. For example, the processing device can determine whether the data stored at XP of the memory cell includes an error. At block 330, if the portion of the memory cell does not include an error, then the data can be provided to the portion of the memory cell. For example, the processing device can provide the data read at block 310 to the XP of the memory cell. In one implementation, the processing device can provide the data to the portion of the memory cell during a second programming pass of a new two-pass programming operation.

At block 340, if the processing device determines that the portion of the memory cell includes an error, then the processing device can perform an error correction operation on the data. For example, the processing device can perform an error correction operation that corresponds to ECC. In one implementation, the processing device can correct the error by switching the bit value of the data from a 0 to a 1 or vice versa. At block 350, the corrected data can be provided to the portion of the memory cell. For example, the corrected data from block 340 can be provided to the XP of the memory cell. In implementations, the corrected data can be provided to the portion of the second memory cell during the second programming pass of the two-pass programming operation.

Figure 4:
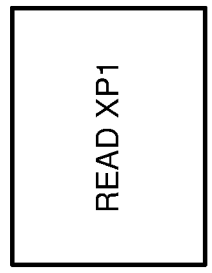
FIG. 4 illustrates an example of performing a two-pass programming on memory cells of a memory device in accordance with some embodiments of the present disclosure.
Figure 4:
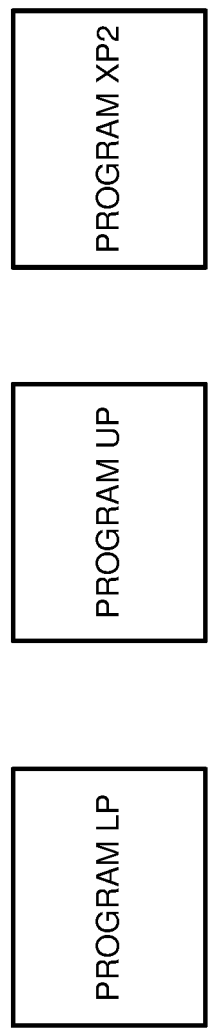
Figure 4:
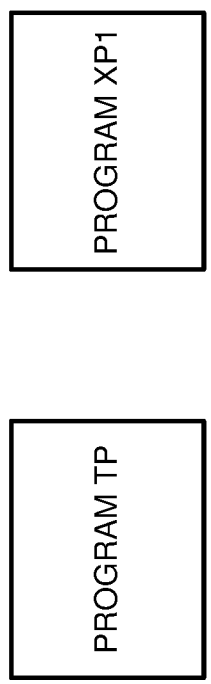

FIG. 4 illustrates an example of performing a two-pass programming operation on memory cells 400 of a memory device in accordance with some embodiments of the present disclosure. In some implementations, the two-pass programming operation can be performed by programming sequence component 113 of FIG. 1. As previously discussed, the two-pass programming operation can be performed on a first memory cell and a second memory cell of the memory cells 400 of a memory device. In implementations, the first memory cell and the second memory cell can be QLC memory.

Prior to the first programming pass, a processing device performs a read operation on the memory cell. For example, a read operation can be performed on the XP of the memory cell (e.g., XP1). In some implementations, an error correction operation can be performed on the data read from the memory cell. During the first programming pass, a programming operation can be performed on a first portion of another memory cell. For example, data can be provided to the LP of the other memory cell. In some implementations, the programming of the LP of the other memory cell can begin during the performance of the read operation on the XP of the memory cell or after the performance of the read operation. A programming operation can be performed on a second portion of the other memory cell. For example, data can be provided to the UP of the another memory cell. In implementations the UP of the other memory cell can be programmed during the programming of the LP of the other memory cell and/or the reading of the XP of the memory cell. A programming operation can be performed on a third portion of the other memory cell. For example, data can be provided to the XP of the other memory cell (e.g., XP2). In one implementation, the XP of the other memory cell can be programmed during the programming of the LP of the other memory cell, the reading of the XP of the memory cell, and/or the programming of the UP of the other memory cell.

The processing device can begin performing the second programming pass on the memory cell. The second programming pass can begin by performing a programming operation on a second portion of the memory cell. For example, data can be provided to the TP of the memory cell. A programming operation can be performed on the first portion of the memory cell. For example, data can be provided to the XP of the memory cell (e.g., XP1). In one implementation, corrected data can be provided to the XP of the memory cell based on the read operation on the first portion of the memory cell, as previously discussed. In some implementations, the XP of the memory cell can be programmed during the programming of the TP of the memory cell.

Figure 5:
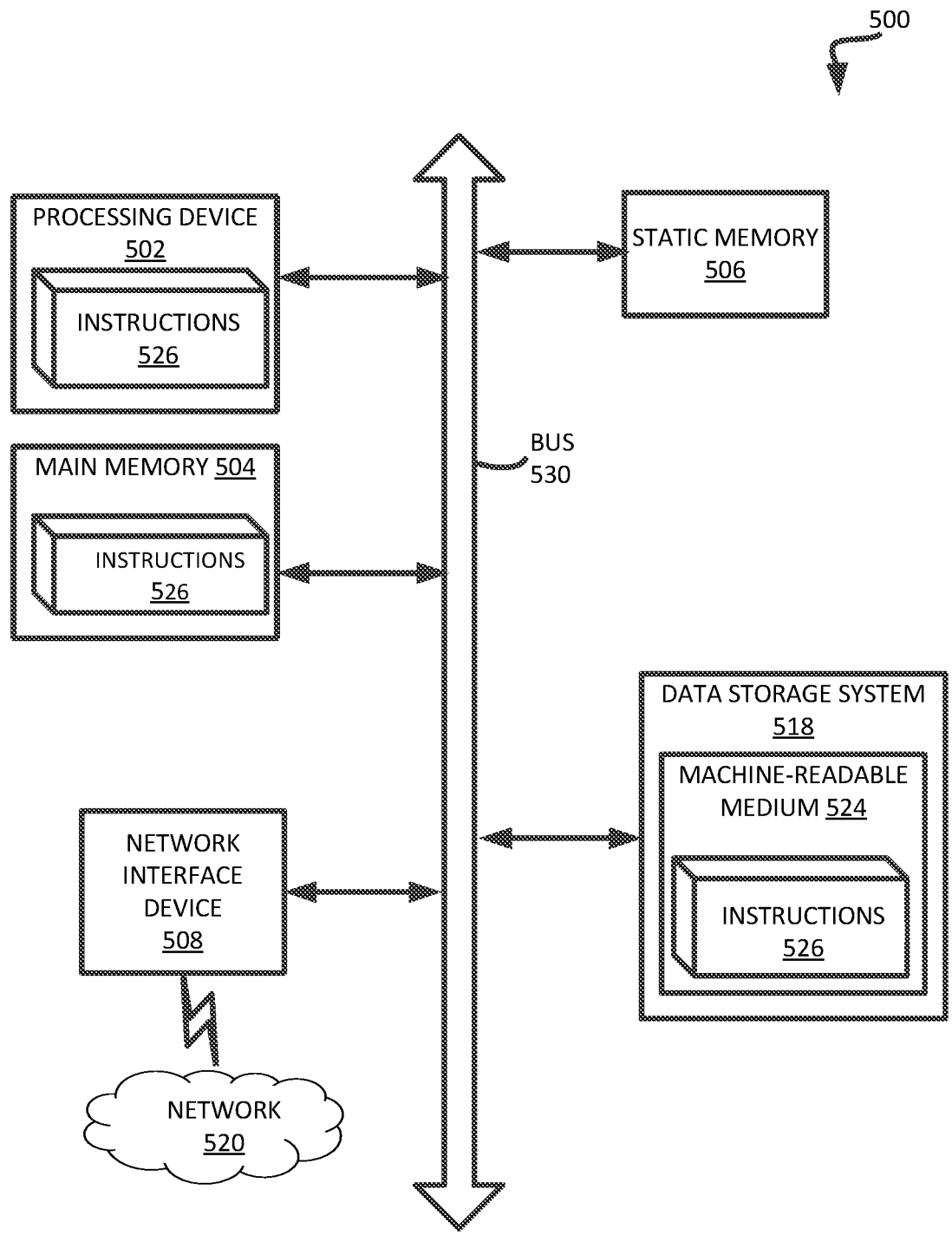
FIG. 5 is a block diagram of an example computer system in which implementations of the present disclosure may operate.

FIG. 5 illustrates an example machine of a computer system 500 within which a set of instructions, for causing the machine to perform any one or more of the methodologies discussed herein, may be executed. For example, the computer system 500 can correspond to a host system (e.g., the host system 120 of FIG. 1) that includes or utilizes a storage system (e.g., the storage system 110 of FIG. 1) or may be used to perform the operations of a controller (e.g., to execute an operating system to perform operations corresponding to the programming sequence component 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 may further include a network interface device 508 to communicate over the network 520.

The data storage system 518 can include a machine-readable storage medium 524 (also known as a computer-readable medium) on which is stored one or more sets of instructions or software 526 embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 may correspond to the storage system 110 of FIG. 1.

In one implementation, the instructions 526 include instructions to implement functionality corresponding to a programming sequence component (e.g., programming sequence component 113 of FIG. 1). While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, aspects of the present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
 a memory; and a processing device, operatively coupled with the memory, to:
    read data from a first portion of a memory cell of a plurality of memory cells;
    perform a first programming pass on another memory cell of the plurality of memory cells by providing new data to the another memory cell; and
    perform a second programming pass on the memory cell by providing additional data to the first portion of the memory cell based on the reading of the data from the first portion of the memory cell, wherein the first programming pass and the second programming pass correspond to a two-pass programming operation associated with the plurality of memory cells.

2. The system of claim 1, wherein to read the data from the first portion of the memory cell, the processing device is further to:
    determine that the data stored at the first portion of the memory cell comprises an error; and
    perform an error correction operation on the data stored at the memory cell of the plurality of memory cells to generate the additional data.

3. The system of claim 1, wherein to perform the first programming pass on the another memory by providing new data to the another memory cell, the processing device is further to:
    provide the new data to a plurality of pages of the another memory cell.

4. The system of claim 1, wherein to perform the second programming pass on the memory cell, the processing device is further to:
    provide data to a particular page of the memory cell.

5. The system of claim 1, wherein the processing device is further to:
    receive subsequent data to be stored at the plurality of memory cells, wherein reading the data from the first portion of the memory cell of the plurality of memory cells is in response to receiving the subsequent data to be stored at the plurality of memory cells.

6. The system of claim 1, wherein the memory cell and the another memory cell of the plurality of memory cells are on a same word line.

7. The system of claim 1, wherein to read the data from the first portion of the memory cell, the processing device is further to:
    determine that the data read from the first portion of the memory cell does not comprise an error; and
    in response to determining that the data read from the first portion of the memory cell does not comprise an error, provide the additional data to refresh the data stored at the first portion of the memory cell of the plurality of memory cells.

8. A method comprising:
    reading data from a first portion of a memory cell of a plurality of memory cells;
    performing, by a processing device, a first programming pass on another memory cell of the plurality of memory cells by providing new data to the another memory cell; and
    performing a second programming pass on the memory cell by providing additional data to the first portion of the memory cell based on the reading of the data from the first portion of the memory cell, wherein the first programming pass and the second programming pass correspond to a two-pass programming operation associated with the plurality of memory cells.

9. The method of claim 8, wherein reading the data from the first portion of the memory cell comprises:
    determining that the data stored at the first portion of the memory cell comprises an error; and
    performing an error correction operation on the data stored at the memory cell of the plurality of memory cells to generate the additional data.

10. The method of claim 8, wherein performing the first programming pass on the another memory cell by providing the new data to the another memory cell comprises:
    providing the new data to a plurality of pages of the another memory cell.

11. The method of claim 8, wherein performing the second programming pass on the memory cell comprises:
    providing data to a particular page of the memory cell.

12. The method of claim 8, further comprising:
    receiving subsequent data to be stored at the plurality of memory cells, wherein reading the data from the first portion of the memory cell of the plurality of memory cells is in response to receiving the data to be stored at the plurality of memory cells.

13. The method of claim 8, wherein the memory cell and the another memory cell of the plurality of memory cells are on a same word line.

14. The method of claim 8, wherein reading the data from the first portion of the memory cell comprises:
    determining that the data read from the first portion of the memory cell does not comprise an error; and
    in response to determining that the data read from the first portion of the memory cell does not comprise an error, providing the additional data to refresh the data stored at the first portion of the memory cell of the plurality of memory cells.

15. A non-transitory computer-readable storage medium comprising instructions that, when executed by a processing device, cause the processing device to:
    read data from a first portion of a memory cell of a plurality of memory cells;
    perform a first programming pass on another memory cell by providing new data to the another memory cell; and
    perform a second programming pass on the memory cell by providing additional data to the first portion of the memory cell based on the reading of the data from the first portion of the memory cell wherein the first programming pass and the second programming pass correspond to a two-pass programming operation associated with the plurality of memory cells.

16. The non-transitory computer-readable storage medium of claim 15, wherein to read the data from the first portion of the memory cell, the processing device is further to:
    determine that the data stored at the first portion of the memory cell comprises an error; and
    perform an error correction operation on the data stored at the memory cell of the plurality of memory cells to generate the additional data.

17. The non-transitory computer-readable storage medium of claim 15, wherein to perform the first programming pass on the another memory cell by providing data to the another memory cell, the processing device is further to:
    provide the new data to a plurality of pages of the another memory cell.

18. The non-transitory computer-readable storage medium of claim 15, wherein to perform the second programming pass on the memory cell, the processing device is further to:
    provide data to a particular page of the memory cell.

19. The non-transitory computer-readable storage medium of claim 15, wherein the processing device is further to:
receive subsequent data to be stored at the plurality of memory cells, wherein reading the data from the first portion of the memory cell of the plurality of memory cells is in response to receiving the data to be stored at the plurality of memory cells.

20. The non-transitory computer-readable storage medium of claim 15, wherein to read the data from the first portion of the memory cell, the processing device is further to:
determine that the data read from the first portion of the memory cell does not comprise an error; and
in response to determining that the data read from the first portion of the memory cell does not comprise an error, provide the additional data to refresh the data stored at the first portion of the memory cell of the plurality of memory cells.

* * * * *